United States Patent [19]
Caridi

[11] Patent Number: 4,952,792
[45] Date of Patent: Aug. 28, 1990

[54] DEVICES EMPLOYING INTERNALLY STRAINED ASYMMETRIC QUANTUM WELLS

[75] Inventor: Elisa A. Caridi, Rumson, N.J.

[73] Assignee: AT&T Bell Laboratories, Murray Hill, N.J.

[21] Appl. No.: 420,968

[22] Filed: Oct. 13, 1989

[51] Int. Cl.$^5$ .................. H01J 40/14; H01L 27/12
[52] U.S. Cl. ........................ 250/211 J; 357/4; 357/30; 250/213 A
[58] Field of Search .............. 250/211 J, 213 A; 357/4, 30 E, 16; 350/386, 353, 354, 96.13, 96.14; 377/102

[56] References Cited

U.S. PATENT DOCUMENTS

| | | | |
|---|---|---|---|
| 4,772,924 | 9/1988 | Bean et al. | 357/16 |
| 4,797,716 | 1/1989 | Chaffin et al. | 357/16 |
| 4,818,079 | 4/1989 | Maserjian | 350/353 |
| 4,825,264 | 4/1989 | Inata et al. | 357/16 |
| 4,827,320 | 5/1989 | Morkoc et al. | 357/16 |
| 4,835,583 | 5/1989 | Morioka et al. | 357/4 |
| 4,851,886 | 7/1989 | Lee et al. | 357/16 |
| 4,862,228 | 8/1989 | Ralph | 357/4 |
| 4,866,489 | 9/1989 | Yokogawa et al. | 357/4 |
| 4,904,859 | 2/1990 | Goossen et al. | 250/211 J |

OTHER PUBLICATIONS

C. Mailhiot et al., Phys. Rev. B, vol. 37, No. 17, Jun. 15, 1988, "Electromodulation of the Electronic Structure . . . ", pp. 10415-10418.
D. L. Smith et al., Phys. Re. Lett., vol. 58, No. 12, Mar. 23, 1987, "Optical Properties of Strained-Layer . . . ", pp. 1264-1267.
D. L. Smith, Solid State Comm., vol. 57, No. 12, 1986, "Strain-Generated Electric Fields in (111) Growth . . . ", pp. 919-921.
D. A. B. Miller, Appl. Phys. Lett. 54(3), Jan. 16, 1989, "Optical Bistability in Self-Electro-Optic . . . ", pp. 202-204.
B. K. Laurich et al., Phys. Rev. Lett., vol. 62, No. 6, Feb. 6, 1989, "Optical Properties of (100)-and (111)-Oriented . . . ", pp. 649-652.
J. G. Beery et al., Appl. Phys. Lett. 54(3), Jan. 16, 1989, "Growth and Characterization of (111) Oriented . . . ", pp. 233-235.

Primary Examiner—David C. Nelms
Assistant Examiner—Michael Messinger
Attorney, Agent, or Firm—Gregory C. Ranieri

[57] ABSTRACT

Misfit strain-induced piezoelectric fields are achieved from a new class of asymmetric quantum well devices which employ a simplified strained layer semiconductor structure. In the simplified structure, at least a single intrinsic lattice-mismatched narrow bandgap layer is included in a wider bandgap p-i-n structure so that the field resulting from biaxial stress is opposed to the electric field in the diode. According to the structure chosen, the biaxial stress may be either biaxial tension or biaxial compression. In reverse bias operation, the p-i-n diode produces a characteristic "blue shift" of the quantum well absorption peaks. As a result of the induced fields and the "blue shift" property of the devices, devices exhibit good on-off contrast with relatively low applied power and exhibit reduced tolerances on the operating wavelength of incident light.

7 Claims, 2 Drawing Sheets

DEVICES EMPLOYING INTERNALLY STRAINED ASYMMETRIC QUANTUM WELLS

CROSS-REFERENCE TO RELATED APPLICATION

This application is related to U.S. Ser. No. 298,591.

TECHNICAL FIELD

This invention relates to the field of photonics devices and, more particularly, to devices employing a p-i-n semiconductor structure.

BACKGROUND OF THE INVENTION

Quantum well devices are being developed in which the quantum well region includes an asymmetric characteristic. Improvements such as lower operating energy and reduced tolerances on the operating wavelength of incident light have been attributed to the incorporation of the asymmetric wells. In the related application cited above and as described in *Appl. Phys. Lett.*, 54 (3), pp. 202–4 (1989), an improved self electrooptic device resulted by including within the device structure an intrinsic quantum well region having an asymmetric electronic characteristic across as narrow bandgap subregion between the two wide bandgap layers defining the quantum well region. As a result of the asymmetry, the quantum well region appeared to polarize electrons and holes within the subregion in an opposite direction relative to a direction for an electric field applied to the self electrooptic effect device. The asymmetric electronic characteristic was realized as a compositionally graded, narrow bandgap layer or as a pair of coupled narrow bandgap layers of differing thicknesses separated by a thin wide bandgap layer.

While the asymmetry may be produced by compositional grading of the energy bandgap for the quantum well materials or by coupling quantum wells of differing thicknesses, it has been shown that a particular class of strained-layer semiconductor structures grown along the [111] axis provide asymmetry and electrooptic effects which arise from large, piezoelectrically generated internal electric fields. The class of strained-layer semiconductor structure is one in which the layers of a superlattice comprise constituent materials which provide alternate regions of biaxial compression and biaxial tension via lattice mismatch to the substrate. Because the signas of the electric polarization vectors are opposite from one region to the next, there is a non-zero divergence of polarization (a polarization charge) at the superlattice interface and a resulting internal electric field directed along the growth axis having opposite polarities from one layer to the next. See, for example, B. Laurich et al., *Phys. Rev. Lett.*, Vol. 62, No. 6, pp. 649-52 (1989); J. Beery et al., *Appl. Phys. Lett.*, 54 (3), pp. 233–5 (1989); C. Mailhoit et al., *Physical Review B*, Vol. 37, No. 7, pp. 10415-8 (1988); D. Smith et al., *Phys. Rev. Lett.*, Vol. 58, No. 12, pp. 1264-7 (1987); and D. Smith, *Solid State Communications*, Vol. 57, No. 12, pp. 919-21 (1986). Although device operaton has been postulated for these particular strained-layer structures, no actual device incorporating these structures has been reported.

SUMMARY OF THE INVENTION

Misfit strain-induced piezoelectric fields are achieved from a new class of assymetric quantum well devices which employ a simplified strained layer semiconductor structure. In the simplified structure, at least a single intrinsic lattice-mismatched narrow bandgap layer is included in a wider bandgap p-i-n structure so that the field resulting from biaxial stress is opposed to the electric field in the diode. According to the structure chosen, the biaxial stress may be either biaxial tension or biaxial compression. In reverse bias operation, the p-i-n diode produces a characteristic "blue shift" of the quantum well absorption peaks. As a result of the induced fields and the "blue shift" property of the devices, devices exhibit good on-off contrast with relatively low applied power and exhibit reduced tolerances on the operating wavelength of incident light.

Several embodiments of the device are shown. In a first embodiment, the asymmetric quantum well structure is shown incorporated in a p-i-n diode. In a second embodiment, the asymmetric quantum well structure is shown incorporated in a self-electrooptic effect device wherein a plurality of strained quantum well layers are included to produce similarly directed strain components.

BRIEF DESCRIPTION OF THE DRAWING

A more complete understanding of the invention may be obtained by reading the following description of specific illustrative embodiments of the principles of this invention in conjunction with the appended drawing in which.

DETAILED DESCRIPTION

Figure 1:
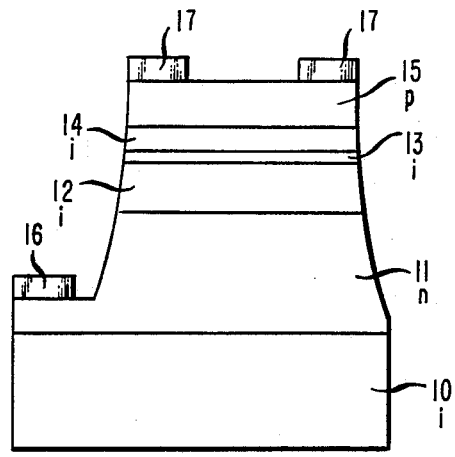
FIG. 1 is a cross-sectional diagram of a p-i-n device in accordance with the principles of the invention.
Figure 3:
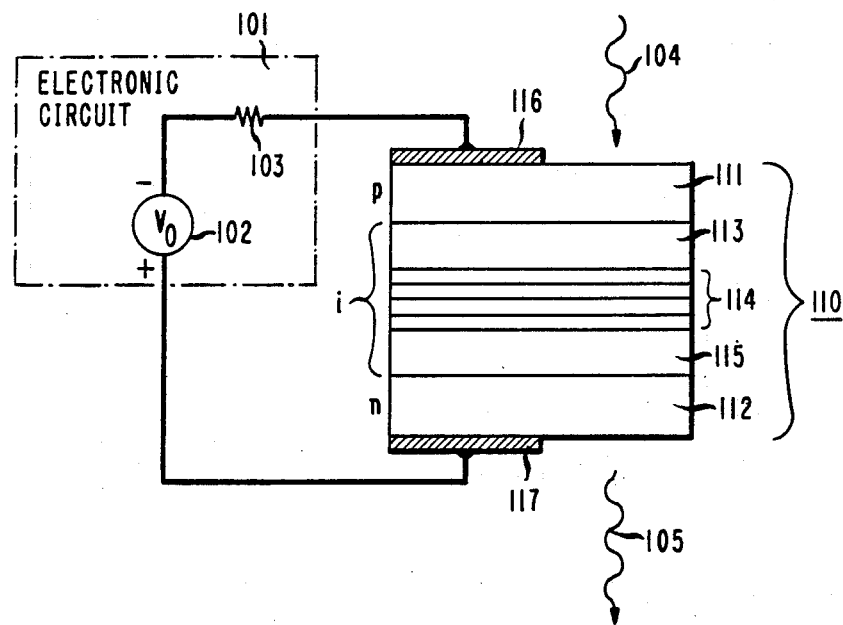
FIG. 3 shows a combined simplified schematic and cross-sectional diagram for a self electrooptic effect device in accordance with the principles of the invention.

Simplified strained-layer semiconductor structures are shown in FIGS. 1 and 3 wherein misfit strain in a lattice mismatched quantum well layer is used to induce a longitudinal built-in electric field. The combined unstrained/strained/unstrained layer geometry wherein the strained layer includes the narrow band quantum well layer provides more flexibility to semiconductor device designers because the novel geometry permits placement of individual or spatially separate plural built-in longitudinal electric fields within any p-i-n device. It also permits the magnitude and direction of the built-in electric field to be controlled easily by the designer.

Strain is understood to be biaxial in the growth plane and to encompass both tension and compression. For tension, it is understood that the lattice constant of the strained layer is smaller than the lattice constant of the substrate material for the device. For compression, it is understood that the lattice constant of the strained layer is larger than the lattice constant of the substrate material for the device.

Although most work in strained layer semiconductor devices has focused on Group III-V semiconductor devices grown along the (100) direction, it is understood that the present invention employs stress dependent behavior from (111) strained layersof piezoelectrically active materials such as zincblende compounds. These materials produce a macroscopic electric polarization when subjected to stress. Since zincblende compounds lack a center of inversion symmetry, stressing the zincblende material can produce a strain, that is, a microscopic displacement of atoms from their equilibrium positions which can give rise to electric polarization.

Electric polarization is produced when the strain causes positive charges to be displaced more or less than corresponding negative charges. Misfit strain which is generated during epitaxial growth is accommodated by competition between elastic deformation and misfit dislocation deformation, both of which act to minimize the strain energy of the epitaxially grown semiconductor structure. For the devices shown in FIGS. 1 and 3, the strain is entirely accommodated by the single quantum well (FIG. 1) and the individual quantum wells (FIG. 3).

Lattice mismatch which develops the strain in the semiconductor material in each quantum well layer is generally obtained by well known techniques by varying the mole fraction for a particular element in the quantum well layer. For example, the device shown in FIG. 1 comprises $In_xGa_{1-x}As$ in the quantum well and GaAs in the remaining layers. By varying the InAs mole fraction x, it is possible to vary the lattice mismatch between the quantum well and GaAs substrate.

The degree of lattice mismatch affects the magnitude of the strain-generated built-in electric field in the quantum well. For the example given above and by using linear interpolation techniques, the magnitude of the electric field can be shown to vary from 0 to approximately $3 \times 10^7$ V/m when the InAs mole fraction varies from 0 to 0.2. Electric fields of this magnitude are known to dramatically alter interband optical absorption of the quantum well via the quantum confined Stark effect. The quantum confined Stark effect is generally employed by p-i-n diode modulators and detectors and self electrooptic effect devices, both of which are discussed separately below.

A p-i-n diode structure realized in accordance with the principles of this invention is shown in FIG. 1 in a cross sectional representation. An approximate energy band diagram for the device shown in FIG. 1 is given in FIG. 2 where corresponding locations for the different regions of the device are shown at the bottom of the figure. It should be noted that the figures have not been drawn to scale in order to improve the understanding of the principles of the present invention.

As shown in FIG. 1, the exemplary p-i-n diode is epitaxially grown by molecular beam epitaxy on substrate layer 10. Substrate layer 10 is composed of substantially undoped or intrinsic GaAs. The substrate surface for growth was the (111)B surface which was miscut 2° toward [100]. Silicon doped GaAs is utilized to form n-type contact layer 11 to a thickness of approximately 2.0 μm with a doping concentration of $2 \times 10^{18}$ cm$^{-3}$. The intrinsic region of the diode comprises barrier layers 12 and 14 and quantum well layer 13. Barrier layers 12 and 14 are substantially undoped or intrinsic GaAs grown to a thickness of approximately 0.7 μm. Quantum well layer 13 is substantially undoped or intrinsic $In_xGa_{1-x}As$ grown to a thickness of approximately 100 Å with a mole fraction of x=0.1. The thickness of the quantum well layer is chosen to be less tha the critical thickness to avoid crystal damage from misfit dislocations. In the example given herein, the critical thickness is between 200 Å and 300 Å for a mole fraction less than 0.2. It should be noted, however, that it is also important to maintain the thickness of quantum well layer 13 within the range commonly understood as necessary to form quantum wells. Beryllium doped GaAs is used to form p-type contact layer 15 at a thickness of approximately 2.0 μm with a dopant concentration of $2 \times 10^{18}$ cm$^{-3}$. Thicknesses for the layers outside the quantum well may be reduced significantly in order to improve transmission of optical signals to the quantum well layer.

Standard wet chemical etching techniques are employed to form mesa diodes as shown in FIG. 1. Ohmic contacts for such diodes are formed by standard techniques including evaporative deposition and alloying of metals. For the example shown in FIG. 1, contact 16 is formed on the isolated n mesa by using an alloyed stack comprising layers of gold, nickel, and gold-germanium. Contact 17 is formed as a ring contact on layer 15 using an alloyed stack comprising layers of gold, gold-zinc and chromium.

Figure 2:
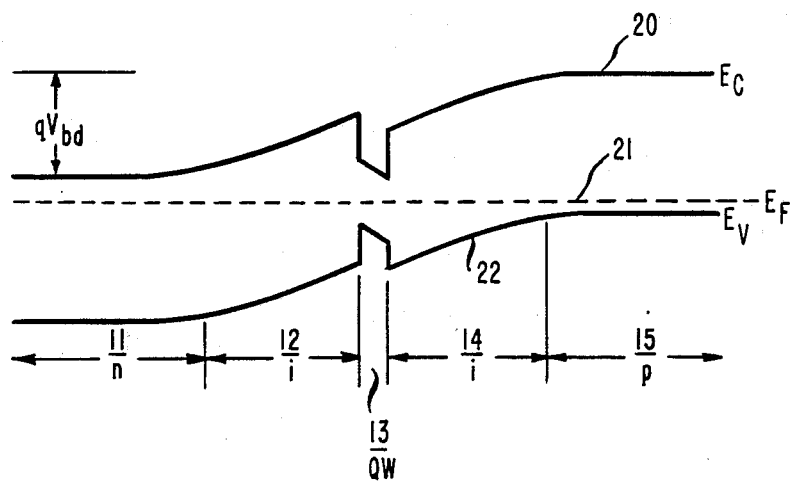
FIG. 2 is a conduction and valence band diagrams for the semiconductor device shown in FIG. 1.

As shown in FIG. 2, the conduction band $E_c$, is drawn as curve 20; the Fermi level $E_f$ is drawn as curve 21; and the valence band $E_v$ is drawn as curve 22. The energy from the built-in field at 0 bias is shown as $qV_{bd}$. It has been estimated that the exemplary device described above exhibits a strain-generated built-in electric field of approximately $1.7 \times 10^5$ V/cm. As seen in FIG. 2, the lattice mismatch in the quantum well layer generates a compressive biaxial stress sufficient to cause a longitudinal strain along the <111> direction for polarization electrons and holes within said quantum well region in an opposite direction relative to a direction of an electric field applied to said structure. To extend the principles of this invention to other material systems or to different initial growth planes, the lattice mismatch in the quantum well layer should be sufficient to cause a biaxial strain and, thereby, a longitudinal strain along the <hhl> direction for polarizing electrons and holes within said quantum well region in an opposite direction relative to a direction of an electric field applied to said structure, where h and l are integer numbers having values greater than or equal to 1.

For those cases where a p-i-n diode is grown with the layer in contact with the <111>B substrate, the strain induced by the lattice mismatch of the quantum well layer should be tension.

While the device described above was shown to be grown on a (111)B substrate, it should be clear to those skilled in the art that the principles of this invention apply equally to devices grown on a (111)A substrate. Polarization effects experienced using a (111)B substrate will be opposite to the effects seen when using a (111)A substrate.

In operation as a photodetector, the diode shown in FIG. 1 is reverse-biased. As the amount of reverse bias potential is increased, it has been observed by photocurrent spectroscopy at the bandedge that electroabsorption peaks of the quantum well become increasingly "blue shifted". That is, the electroabsorption peaks are translated to shorter wavelengths. Further discussion of "blue shift" and benefits derived therefrom is presented below with reference to the self electrooptic effect device.

In order to better understand operation of the device shown in FIG. 3, it is best to review some fundamentals about self electrooptic effect devices and optical bistability. Optically bistable switching devices have been developed in a class known as self electrooptic effect devices (SEED). See U.S. Pat. No. 4,546,244. In SEED devices, optical bistability relies on incorporating semiconductor material whose absorption increases with increased excitation of the incorporated material.

An optically bistable SEED device generally comprises the interconnection of a p-i-n diode having an intrinsic quantum well region, an electrical or electronic load, and a bias voltage supply. The load and bias voltage supply are arranged in a feedback loop around the diode usually in a reverse bias configuration. When an electric field is applied perpendicular to the quantum well layers to permit electroabsorption by the quantum-confined Stark effect (QCSE), the absorption band edge including any sharp exciton resonance peaks is shifted to lower photon energies to achieve transmission changes of approximately 50%. Because the absorption edge is shifted toward lower photon energy under applied field conditions, the device is called a "red shift" device owing to the lower photon energy of red light in the visible light spectrum. Interband transitions give rise to a substantial amount of absorption for the biased SEED device. In general, the contrast between the low and high absorption states of the device is sufficient to permit realization of useful devices for modulation and the like.

With low optical power incident on the seed device, nearly all the bias voltage is dropped across the diode because there is negligible, if any, photocurrent. The wavelength of light incident on the photodiode is carefully selected to be at or near the exciton resonance wavelength at zero applied field for peak or maximum absorption of the light. As incident light impinges on the reverse biased p-i-n diode, an increasing photocurrent is generated to, in turn, reduce the voltage across the diode by increasing the voltage drop across the load. The reduced voltage permits increased absorption to occur as the exciton resonance peak shifts back toward its zero applied field wavelength. Increased absorption provides a further increased photocurrent which, under proper regenerative feedback conditions, yields device switching.

Optically bistable SEED devices have been developed and reported in the prior art to operate in accordance with the principles set forth above. These devices have exhibited room temperature operation at high speed and low switching energy despite the lack of a resonant optical cavity which is commonly used to reduce switching energy. Moreover, such devices have been characterized by quantum well regions employing symmetric quantum wells. Symmetric quantum wells are known to produce the desired band edge absorption shift (a red shift) under applied field conditions so that increased absorption of incident light leads to switching necessary for bistable device operation.

FIG. 3 shows a schematic diagram of a self electrooptic effect device comprising a p-i-n diode having an asymmetric quantum well region in accordance with the principles of the invention. Light beam 104 impinges on semiconductor device 110. A fraction of light beam 104 emerges from semiconductor device 110 as light beam 105. Semiconductor device 110 is biased by electronic circuit 101. For the example shown in FIG. 1, electronic circuit 101 includes reverse-bias voltage $V_0$ from bias voltage supply 102 connected in series with resistor 103 and semiconductor device 110.

Electronic circuit 101 may include a number of other components such as transistors, phototransistors and the like in series or parallel combination with a proper voltage or current supply. Realizations of electronic circuit 101 are shown throughout U.S. Pat. No. 4,546,244. These realizations are incorporated herein expressly by reference.

The optical characteristics of semiconductor device 110 for the former self electrooptic device of the '244 patent are such that an increasing light intensity from input beam 104 leads to an increasing absorption coefficient by semiconductor device 110. Interconnection with electronic circuit 101 provides a positive feedback mechanism to permit increasing optical absorption of light energy by semiconductor device 110 to lead to an increased optical absorption coefficient. It should be noted that when reference is made to the optical absorption coefficient it is also understood to encompass a reference in the alternative to the index of refraction because changes in the absorption spectrum also result in changes to the index of refraction as described in the Kramers-Kronig relationship.

For a semiconductor device 110 operating in accordance with the principles of the present invention, semiconductor device 110 operates by a different mechanism from the former device described immediately above. While the former semiconductor device included a symmetric quantum well region for its excitonic peaks as the mechanism for obtaining decreasing absorption with increasing field, the present semiconductor device 110 does not rely at all on excitonic peaks in the quantum well region to produce absorption changes with field variations. In the present semiconductor device 110, it is desirable only that the input light beam 104 be at a wavelength near the bandgap energy of the quantum well region at zero applied field.

As shown in FIG. 3, semiconductor device 110 is contacted by electrical contact pads 116 and 117 in order to facilitate contact to electronic circuit 101. Generally, the electrical contact pads are standard ring contacts to permit a clear optical path for ingress and egress of light beams with respect to the semiconductor device and, more importantly, the quantum well region. Semiconductor device 110 includes a p-i-n structure wherein spacer regions 113 and 115 and quantum well region 114 are either intrinsic or nominally undoped, contact region 111 is p-type material and contact region 112 is n-type material. It is contemplated that quantum well region 114 include one or more quantum well layers of narrow bandgap, lattice-mismatched semiconductor material bounded on either side by a barrier layer of significantly wider bandgap, lattice-matched semiconductor material.

Quantum well region 114 is required to exhibit an asymmetry in a predetermined electronic characteristic as the quantum well region is traversed from one buffer layer to the other, that is, from layer 113 to 115. The asymmetric characteristic is responsible for providing the "blue shift" in response to an increased applied field. It is preferred to incorporate the asymmetric characteristic in such a way that electrons and holes confined within each quantum well are polarized relative to each other in the quantum well region in an opposite direction to that which would be achieved by the electric field applied to the semiconductor device 110 on its own. Stated alternatively, it is preferred that the electron wave function be confined more toward the p-type side of the p-i-n diode than is the hole wave function, which spreads more toward the n-type side of the diode than does the electron wave function.

Semiconductor device 110 may be fabricated by standard epitaxial processing techniques including molecular beam epitaxy and vapor phase epitaxy such as metal organic chemical vapor deposition.

Figure 4:
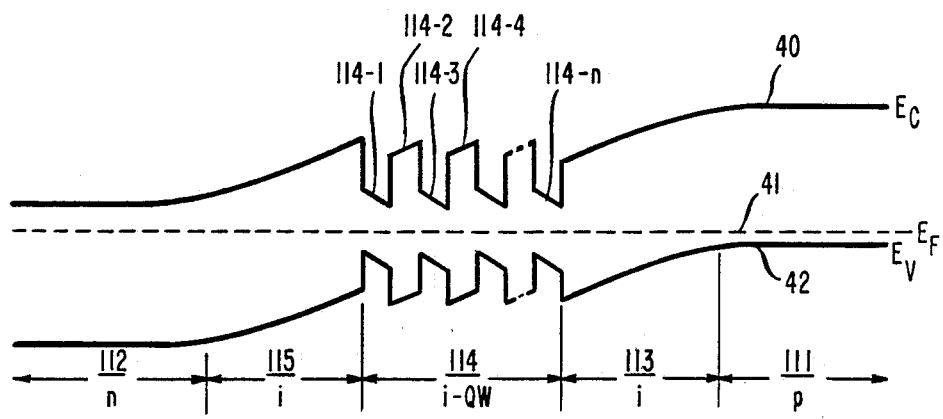
FIG. 4 shows the conduction and valence band diagrams for the self electrooptic effect device shown in FIG. 3.

For the device shown in FIG. 3, the growth process is started with in contact region 112 with GaAs substrate of greater than approximately 1000 Å thickness being doped with silicon to exhibit n+ conductivity with a concentration of $2 \times 10^{18}$ atoms/cm$^3$. The contact region 112 is grown on <111<B undoped GaAs substrate. In practice, it may be desirable to employ substrates which are miscut to expose a vicinal surface wherein the miscut is several degrees or tenths of degrees toward a particular axis such as [100] to improve surface nucleation. A buffer layer of GaAs doped similarly to the contact region with silicon to exhibit n+ conductivity with a concentration of $10^{18}$ atoms/cm$^3$ is grown on region 112. Epitaxially deposited on the buffer layer is a GaAs spacer layer which is intrinsic or nominally undoped and which has a thickness of approximately 700 Å. Nominally undoped strained layer quantum well region 114 includes one or more lattice-mismatched $In_xGa_{1-x}As$ layers having a thickness of approximately 70 Å and a mole fraction of approximately 0.1. The InGaAs layers are alternated with undoped layers of GaAs having a thickness of approximately 150 Å. The addition of more than one period of the asymmetric quantum well permits increased enhancement of the absorption coefficient. For the example shown in FIG. 3 whose band diagram is shown in FIG. 4, approximately 10 periods of quantum wells are employed. An undoped or intrinsic spacer layer of GaAs is grown on quantum well region 114 to a thickness of approximately 700 Å. Contact region 111 is grown on spacer region 113 to have a GaAs contact layer with thickness approximately 2000 Å doped with beryllium to exhibit p+ conductivity having a concentration of $2 \times 10^{18}$ atoms/cm$^3$.

A profile of the conduction band 40 and valence band 42 is shown in FIG. 4 for zero applied electric field on self electrooptic effect device 110. The Fermi level energy is depicted as dash line 41 having a notation $E_F$. The conduction and valence band energies are depicted as $E_c$ and $E_v$, respectively. In quantum well region 114, the asymmetric electronic characteristic is shown as alternating sections of strained and unstrained thin intrinsic layers. Strained layers are shown as quantum wells 114-1, 114-3, and 114-n. Unstrained layers are shown as barriers 114-2, 114-4, and the intrinsic buffers 113 and 115.

For the semiconductor device 110 shown in FIG. 3 operating with no applied field from the electronic circuit, there is a displacement of the lowest energy level wave function toward a more highly confined state in the narrower bandgap portion of the strained layer quantum well structure. Only the amount of shift differs for holes and electrons because heavy holes are more easily perturbed as a result of their large mass and small confinement energies thereby shifting more than electrons. As a consequence of this shift at zero applied field, there is a net average separation of holes and electrons or, alternatively, a net polarization of each electron-hole pair. This is analogous to a field effect caused by prebiasing a symmetric quantum well structure with a static electric field. If a field is applied from electronic circuit 101 via contact pads 116 and 117, the separation of electrons and holes is reduced so that the resulting quantum confined Stark effect begins as a "blue shift" (shift toward higher energy, $\hbar v$) of the lowest electron-hole transition. This type of shift is completely opposite to the "red shift" exhibited by the prior art symmetric quantum well structures. Moreover, the "blue shift" device allows decreasing absorption coefficient with increasing field without regard to excitonic peaks as required by symmetric quantum wells in the prior art. Operation of the device is expected to be preferred in the region near the bandgap energy for quantum well region 114 at zero applied electric field. In particular, it is preferred that input light beam 104 have a mean photon energy slightly below the band-edge absorption peak in its state of maximum "blue shift." Then semiconductor device 110 would be shifted between one state, where absorption is lowest (corresponding to maximum "blue shift" of the absorption band edge), using a high voltage to a second state, where absorption is high, using a low voltage.

While it has been stated that the precise parameters defining the excitonic peaks are less crucial for the present asymmetric quantum well device, it is important to consider suppression of exciton field ionization to avoid broadening the absorption band-edge with applied field. Such broadening would lead to degraded device performance. Also, it should be noted that the dimensions of the buffer layers should be thick enough to avoid band bending effects near the edges of the strained quantum well layers.

Other configurations of the device 110 are contemplated within the spirit and scope of the present invention. For example, it is understood that the present invention is extensible to devices in which the resistor is integrated with the p-i-n diode. Also, a compound p-n-p-i-n structure is contemplated in which the p-n diode forms the photodiode and the p-i-n structure is the integrated modulator including the asymmetric quantum well region. It is further understood that the use of asymmetric quantum well regions is contemplated for all forms of self electrooptic effect devices such as the symmetric SEED and the asymmetric SEED.

It is understood that, while the material system GaAs/InGaAs is described above for fabricating the semiconductor device having the asymmetric quantum well region, other material combinations may be selected from other semiconductor Group III-V systems such as GaAs/AlGaAs, AlGaAs/InGaAs, GaAs/AlAs, InGaAs/InAlAs, GaAs/InAs, InGaAs/InGaAlAs, GaAsSb/GaAlAsSb and InGaAsP/InP. Finally, extension of the device structures is also contemplated to Group II-VI, Group II-VI/Group IV, and Group III-V/Group IV semiconductor compounds.

While lattice matching and mismatching has been defined with respect to the substrate, it is understood by those skilled in the art that a match or mismatch of lattice constants can be defined more generally with respect to any layer whose thickness significantly exceeds the thickness of the strained layer.

I claim:
1. An optical device comprising
  means responsive to light for generating a photocurrent,
  a structure having a semiconductor quantum well region, and
  means responsive to said photocurrent for electrically controlling a coefficient of absorption of said semiconductor quantum well region in order to cause said index of refraction to vary in response to varia- tions of said photocurrent, said optical device characterized in that,
said semiconductor quantum well region includes first and second layers and a subregion between and in contact with said first and second layers, said first and second layers comprising wide bandgap lattice matched semiconductor material, said subregion comprising at least one layer of substantially narrow bandgap semiconductor material, said subregion being lattice mismatched to cause a longitudinal strain along the <hhl> direction for polarizing electrons and holes within said quantum well region in an opposite direction relative to a direction of an electric field applied to said structure, where h and l are integer numbers having values greater than or equal to 1.

2. A semiconductor device grown on a semiconductor substrate, said device comprising an n-type conductivity region, a quantum well region, and a p-type conductivity region,
said quantum well region including a first layers, a second layer, and a subregion between and in contact with said first and second layers, said first and second layers comprising substantially intrinsic semiconductor material substantially lattice matched to said substrate, said subregion comprising at least one layer of substantially intrinsic semiconductor material having a bandgap narrow than a corresponding bandgap in said first and second layers, said subregion being lattice mismatched to said substrate to cause a longitudinal strain along the <hhl> direction for generating an electric field in an opposite direction relative to a direction of an electric field applied to said structure, where h and l are integer numbers having values greater than or equal to 1.

3. The semiconductor device defined in claim 2 wherein said n-type, p-type and quantum well regions comprise zincblende semiconductor material.

4. The semiconductor device defined in claim 3 wherein said zincblende material is selected from the group consisting of Group III-V semiconductor compositions.

5. A semiconductor device grown on a semiconductor substrate, said device comprising an n-type conductivity region, a quantum well region, and a p-type conductivity region,
said quantum well region including a first layers, a second layer, and a subregion between and in contact with said first and second layers, said first and second layers comprising substantially intrinsic semiconductor material substantially lattice matched to said substrate, said subregion comprising a plurality of strain layers composed of substantially intrinsic semiconductor material having a bandgap narrower than a corresponding bandgap in said first and second layers, said strained layers being separated from one another by a corresponding plurality of unstrained layers composed of substantially intrinsic semiconductor material substantially lattice matched to said substrate and having a bandgap wider than a corresponding bandgap in said strained layers, said strained layers being lattice mismatched to said substrate to cause a longitudinal strain along the <hhl> direction for generating an electric field in an opposite direction relative to a direction of an electric field applied to said structure, where h and l are integer numbers having values greater than or equal to 1.

6. The semiconductor device defined in claim 5 wherein said n-type, p-type and quantum well regions comprise zinc blende semiconductor material.

7. The semiconductor device defined in claim 6 wherein said zincblende material is selected from the group consisting of Group III-V semiconductor compositions.

* * * * *